United States Patent
Yu et al.

(10) Patent No.: US 10,156,794 B1
(45) Date of Patent: Dec. 18, 2018

(54) POSITIONING DEVICE FOR ALIGNING SEMICONDUCTOR TOOL AND OVERHEAD HOIST TRANSPORT SYSTEM

(71) Applicant: Taiwan Semiconductor Manufacturing Co., Ltd., Hsinchu (TW)

(72) Inventors: Sheng-Kang Yu, Hsinchu (TW); Yu-Fu Lin, Hsinchu (TW); Chia-Chen Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/692,098

(22) Filed: Aug. 31, 2017

(51) Int. Cl.
| | | |
|---|---|---|
| G01C 15/10 | (2006.01) |
| G02B 26/08 | (2006.01) |
| G01B 11/27 | (2006.01) |
| G03F 7/20 | (2006.01) |
| H01L 21/033 | (2006.01) |
| H01L 21/308 | (2006.01) |
| H01L 21/68 | (2006.01) |
| G01B 11/16 | (2006.01) |
| G01B 11/26 | (2006.01) |
| G01D 5/26 | (2006.01) |
| G03F 7/00 | (2006.01) |

(52) U.S. Cl.
CPC .......... G03F 7/70358 (2013.01); G01B 11/16 (2013.01); G01B 11/26 (2013.01); G01B 11/27 (2013.01); G01D 5/26 (2013.01); G03F 7/001 (2013.01); G03F 7/2037 (2013.01); H01L 21/0331 (2013.01); H01L 21/3086 (2013.01); H01L 21/682 (2013.01)

(58) Field of Classification Search
CPC .. G01C 15/105; G01C 15/004; G01C 15/002; G01C 15/006; B66B 19/002; G02B 26/08; Y10S 33/21
USPC ....... 33/286, 227, 282, 392; 356/250, 141.3, 356/247; 372/107, 108
See application file for complete search history.

(56) References Cited

U.S. PATENT DOCUMENTS

| | | | | |
|---|---|---|---|---|
| 5,307,368 A | * | 4/1994 | Hamar | G02B 26/08 356/141.3 |
| 5,644,850 A | * | 7/1997 | Costales | G01C 15/105 33/282 |
| 5,754,287 A | * | 5/1998 | Clarke | G01C 15/105 33/227 |
| 6,028,665 A | * | 2/2000 | McQueen | G01C 15/105 33/227 |

(Continued)

*Primary Examiner* — David A Vanore
(74) *Attorney, Agent, or Firm* — McClure, Qualey & Rodack, LLP

(57) ABSTRACT

Positioning devices and positioning methods are provided. The positioning device includes a laser source and an optical assembly. The optical assembly is configured to direct a laser beam projected from the laser source toward a floor and a ceiling of a semiconductor fabrication facility to generate a first laser line on the floor and a second laser line on the ceiling. The first laser line and the second laser line are parallel to and aligned with each other when viewed in a direction perpendicular to the floor and the ceiling. Accordingly, the first laser line and the second laser line can be used to align a semiconductor tool and an overhead hoist transport system in the semiconductor fabrication facility.

20 Claims, 12 Drawing Sheets

(56) References Cited

U.S. PATENT DOCUMENTS

| | | | | |
|---|---|---|---|---|
| 6,397,484 B1* | 6/2002 | Greene | ............... | G01C 15/105 |
| | | | | 33/392 |
| 2015/0316374 A1* | 11/2015 | Winter | ................ | G01C 15/002 |
| | | | | 33/293 |
| 2016/0311648 A1* | 10/2016 | Vaarala | ..................... | B66B 5/00 |
| 2018/0106616 A1* | 4/2018 | Jiang | ................... | G01C 15/004 |

* cited by examiner

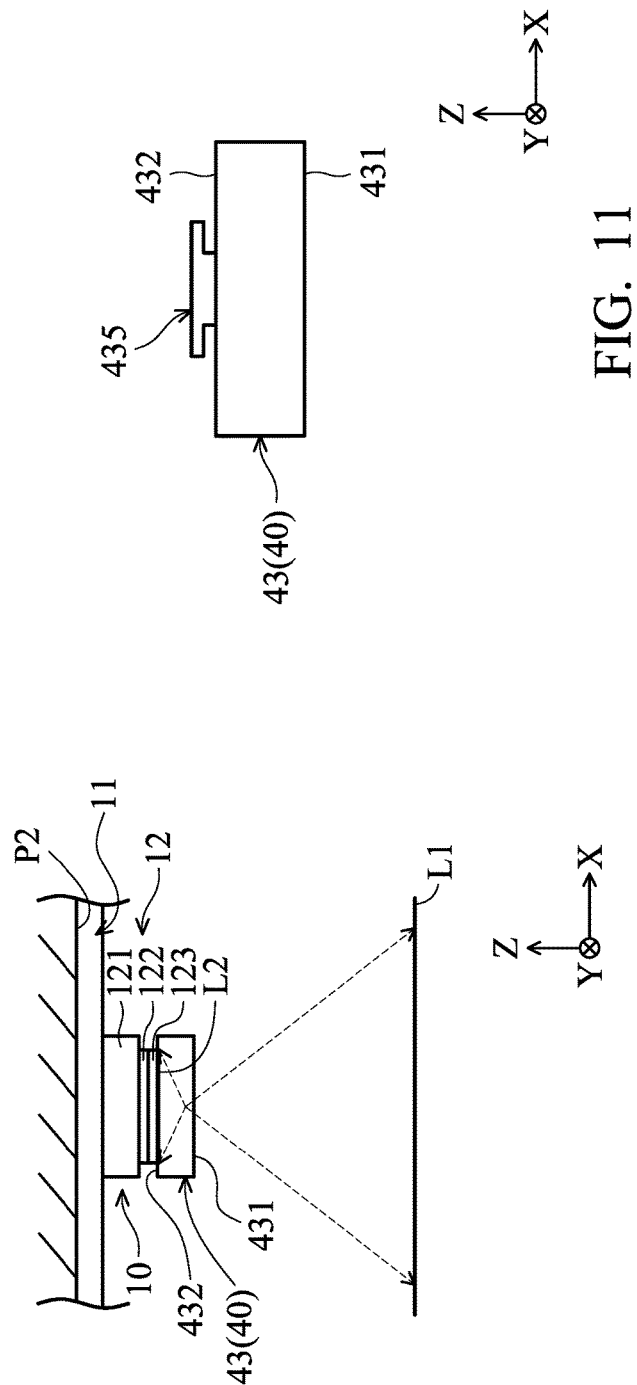

POSITIONING DEVICE FOR ALIGNING SEMICONDUCTOR TOOL AND OVERHEAD HOIST TRANSPORT SYSTEM

BACKGROUND

Automated material handling systems (AMHS) are widely used in semiconductor fabrication facilities (FABs) to automatically handle and transport groups or lots of wafers between various processing machines (i.e. semiconductor tools) used in chip fabrication. The AMHS is computer controlled for handling the staging of wafers for processing and the flow of wafer traffic in the FAB. In addition, an AMHS may also be used to automatically handle and transport photomask reticles between various semiconductor tools during the fabrication process.

The AMHS typically includes numerous types of automated and manual mechanisms for moving and transporting the carriers for storing wafers or reticles throughout the FAB during the fabrication process. This can include, for example, automatic guided vehicles (AGVs), personal guided vehicles (PGVs), rail guided vehicles (RGVs), overhead shuttles (OHSs), and overhead hoist transports (OHTs).

Among the foregoing transport mechanisms of the AMHS, OHTs are commonly used to transport the wafer carriers or retile carriers from the load port of one semiconductor tool to the load port of the next semiconductor tool in the processing sequence. An OHT system includes at least one vehicle that travels on an overhead monorail of the AMHS. The vehicle on-board hoist is operable to raise and lower the wafer carriers or reticle carriers, thereby allowing the vehicle to deposit and retrieve the wafer carriers or reticle carriers from the load ports of semiconductor tools positioned along and on the floor beneath the overhead rail.

Although existing OHT systems for transporting wafers or reticles in a FAB during the fabrication process have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which:

FIG. 10 is a schematic view illustrating an intermediate stage of a positioning method of using a positioning device in accordance with some embodiments.

FIG. 11 is schematic view illustrating the top surface of the positioning device in FIG. 10 with a mating flange in accordance with some embodiments.

DETAILED DESCRIPTION

Figure 1:
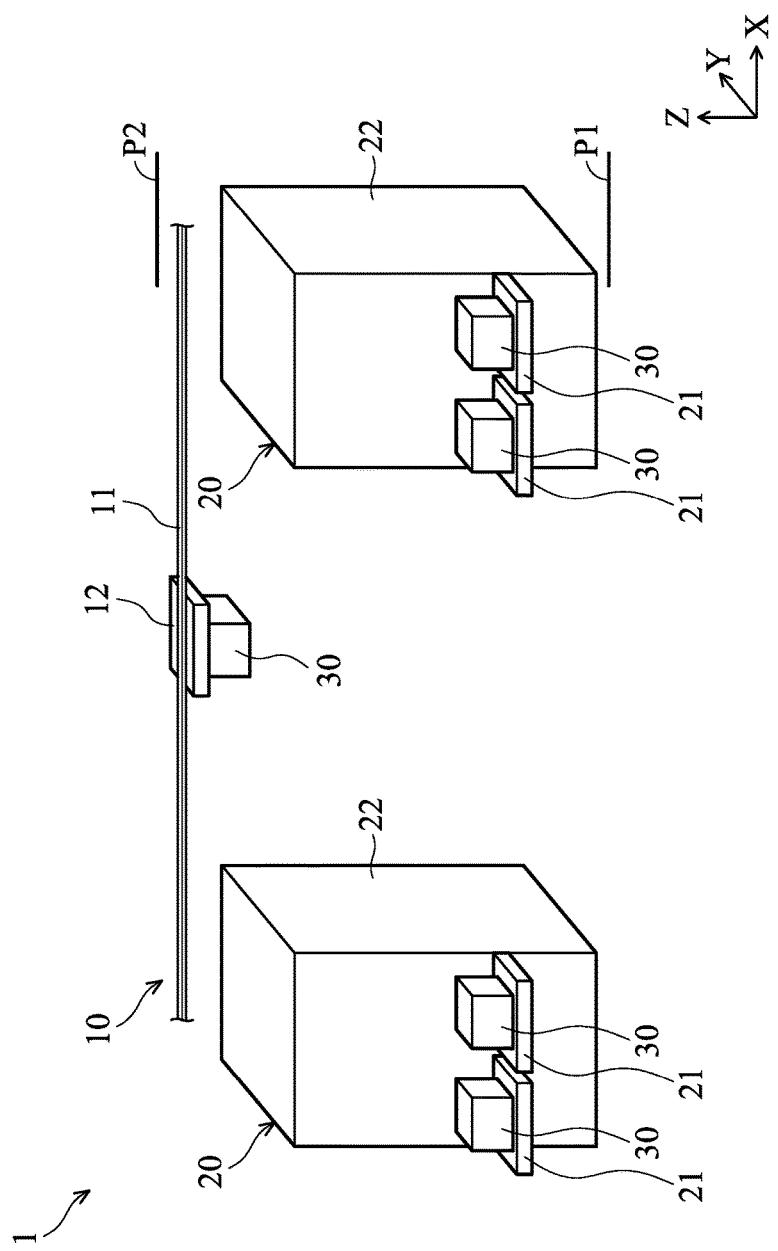
FIG. 1 is a schematic view of a part of a semiconductor fabrication system in a semiconductor fabrication facility (FAB) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "lower," "upper," "horizontal," "vertical,", "above," "below," "up," "down," "top" and "bottom" as well as derivative thereof (e.g., "horizontally," "downwardly," "upwardly," etc.), may be used herein for ease of description to describe one element or feature's relationship to another element(s) or feature(s) as illustrated in the figures. The spatially relative terms are intended to encompass different orientations of the device in use or operation in addition to the orientation depicted in the figures. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

FIG. 1 schematically illustrates a perspective view of a part of a semiconductor fabrication system 1 in a semiconductor fabrication facility (FAB) in accordance with some embodiments of the present disclosure. The semiconductor fabrication system 1 includes one or more overhead hoist transport (OHT) systems 10 which may be used to transport semiconductor wafers or photomask reticles within the FAB. In some embodiments, the FAB is divided into various process bays (not shown) such as ion implantation bay, lithography bay, deposition bay, etching bay, diffusion bay, test bay and the like, each including multiple semiconductor tools with the same or different functions, for performing various processes in chip fabrication. The OHT systems 10 transport wafers or reticles between semiconductor tools either in the same process bay (i.e. intra-bay transportation) or between process bays (i.e. inter-bay transportation) during the fabrication process.

In some embodiments, each OHT system 10 includes a network of stationary rails 11 configured to guide the movement of one or more wheeled vehicles 12 supported and suspended from the rails 11. In some embodiments, the rails 11 are monorails that are mounted to and suspended from the ceiling P2 of the FAB. It should be appreciated that the rails 11 may have any suitable cross-sectional configuration so long as the vehicles 12 are appropriately supported from the rail 11 for rolling motion.

The vehicles 12 are operable to transport wafer carriers or reticle carriers (hereinafter referred to as "carriers") 30 throughout the FAB for intra-bay or inter-bay movement. Each vehicle 12 is configured and structured to hold a carrier 30 housing one or more wafers or reticles and transport the carrier 30 in a horizontal or lateral direction from one location to another within the FAB. In addition, each vehicle 12 is configured and operable to pickup, raise/lower, hold, articulate, and release a carrier 30.

Figure 2:
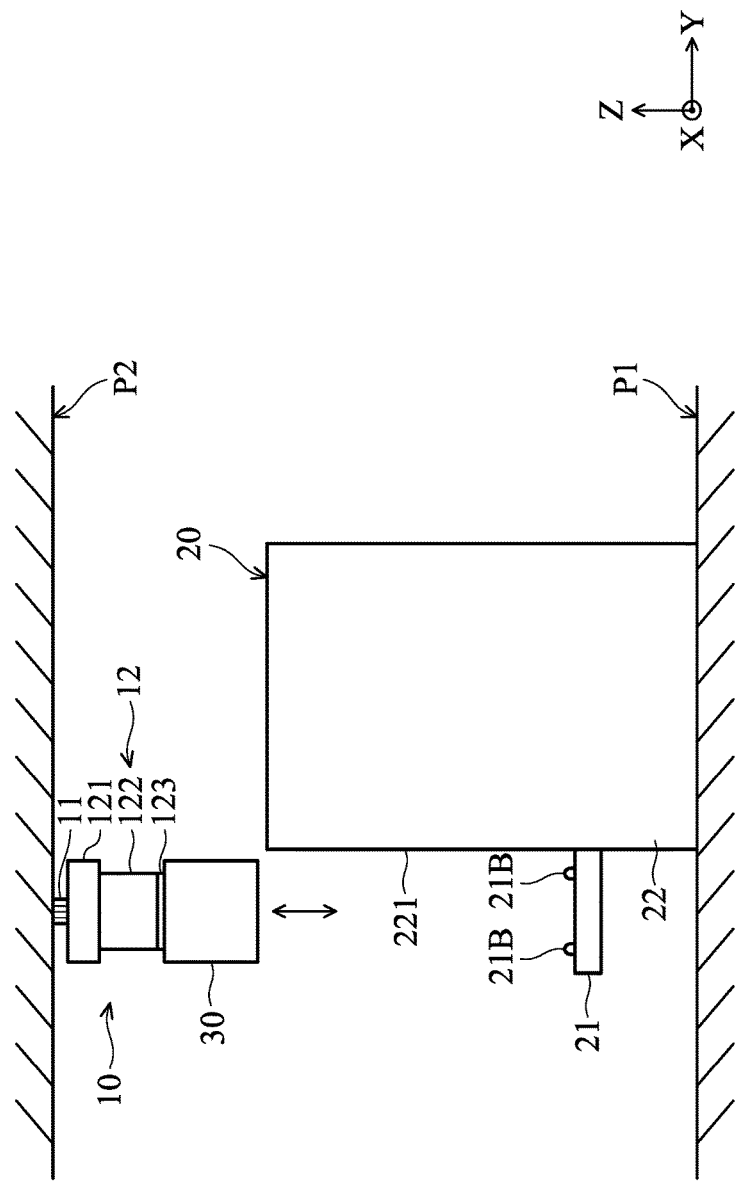
FIG. 2 is a schematic view illustrating the relative position of an overhead hoist transports (OHT) system and a semiconductor tool in FIG. 1 when viewed from a viewing angle.

In some embodiments as shown in FIG. 2, the vehicle 12 includes a wheel mechanism 121 and a hoisting mechanism 122 coupled to the wheel mechanism 121. The wheel mechanism 121 may be motor-driven to travel along the rail 11. The hoisting mechanism 122 includes one or more retractable and extendable gripper arms having a gripper 123 on the end thereof configured to lock onto a mating flange (not shown) on the top surface of the carrier 30. The hoisting mechanism 122 may be motor-driven or pneumatic-driven to vertically raise and lower the gripper 123 and the attached carrier 30.

In some embodiments, the carriers 30 comprise standard mechanical interface (SMIF) pods which can hold a plurality of wafers (e.g. 200 mm or 8 inch), or front opening unified pods (FOUPs) which can hold larger wafers (e.g. 300 mm (12 inch) or 450 mm (18 inch)). Each wafer carrier 30 can hold on the order of approximately 25 wafers, for example. Alternatively or additionally, the carriers 30 may include other SMIF pods which can hold one or more reticles.

In some embodiments, each carrier 30 has various appurtenances including without limitation a plurality of coupling mechanisms (not shown) on the bottom surface for docking to a load port 21 of a semiconductor tool 20, a mating flange (not shown) on the top surface for grasping by the gripper 123 of a vehicle 12 of an OHT system 10, and an openable/closeable and sealable door (not shown) on a side surface for maintaining the wafers or reticles in a controlled environment during transport isolated from the ambient FAB conditions to prevent contamination.

With continuing reference to FIG. 1 and FIG. 2, the semiconductor fabrication system 1 also includes a plurality of semiconductor tools 20 provided in the FAB and supported from and mounted to the floor P1 of the FAB. The semiconductor tools 20 may include any type of wafer processing, metrology, inspection, testing or other tools, and wafers or reticles storage equipment such as stockers used in semiconductor chip fabrication.

Figure 3:
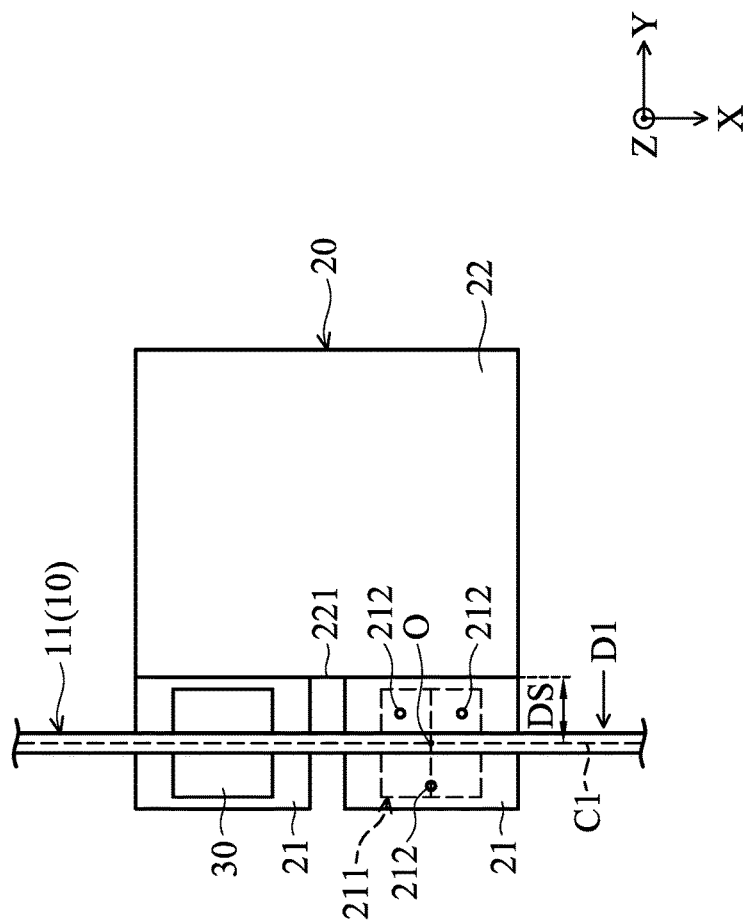
FIG. 3 is a schematic view illustrating the relative position of a rail of the OHT system and a semiconductor tool in FIG. 1 when viewed from another viewing angle.

In some embodiments, each semiconductor tool 20 includes one or more load ports 21 configured to support and dock the carriers 30 for facilitating insertion and removal of wafers or reticles into/from the main body 22 of the semiconductor tool 20. As shown in FIG. 2 and FIG. 3, the load ports 21 are plate structures extended from the main body 22 and positioned along the rail 11 (e.g. parallel to the X-axis direction) of the OHT system 10 so as to receive the carriers 30 transferred from the vehicle 12 of the OHT system 10. Although not shown, the main body 22 of the semiconductor tool 20 has one or more openable/closeable and sealable access doors on a front surface 221 (e.g. parallel to the X-axis direction) and corresponding to the doors of the carriers 30 docked on the load ports 21 for transferring wafers or reticles between the carriers 30 and the semiconductor tool 20.

In some embodiments as shown in FIG. 3, each load port 21 has a coupling interface 211 that includes a plurality of protruding coupling pins 212 corresponding to the coupling mechanisms such as grooves (not shown) of each carrier 30 so as to successfully couple to the carrier 30 and dock the carrier 30 at a predetermined position on the load port 21. The dimensions of the coupling interface 211 correspond to the dimensions of the bottom surface of the carrier 30, and the center O of the coupling interface 211 is horizontally spaced from the front surface 221 of the main body 22 by a distance DS, when viewed along a direction (e.g. the Z-axis direction) perpendicular to the load port 21. The distance DS may be determined by the size of the carrier 30.

Note that, if the rail 11 of the OHT system 10 and the coupling interface 21A are not in a correct relative position, for example, the center line C1 (e.g. parallel to the X-axis direction) of the rail 11 is shifted with respect to the center O of the coupling interface 211 in a horizontal direction D1 (e.g. the Y-axis direction) perpendicular to the front surface 221, the carrier 30 transferred from the OHT system 10 may fail to dock onto the load port 21 due to the interference from the coupling pins 212.

This is because the misalignment of the rail 11 of the OHT system 10 and the load port 21 of the semiconductor tool 20 during installation. In such situation, the operators may need to manually re-install and reposition the semiconductor tool 20 on the floor P1 in the FAB so that the rail 11 of the OHT system 10 is accurately aligned with the load port 21 of the semiconductor tool 20 (i.e. the center line C1 of the rail 11 passes through the center O of the coupling interface 211). As a result, the installation time and the cost are increased, and the production yield is reduced.

Embodiments of positioning devices and positioning methods for assisting alignment of the rail 11 of an OHT system 10 and the load port 21 of a semiconductor tool 20 in the FAB are provided as described below.

Figure 4:
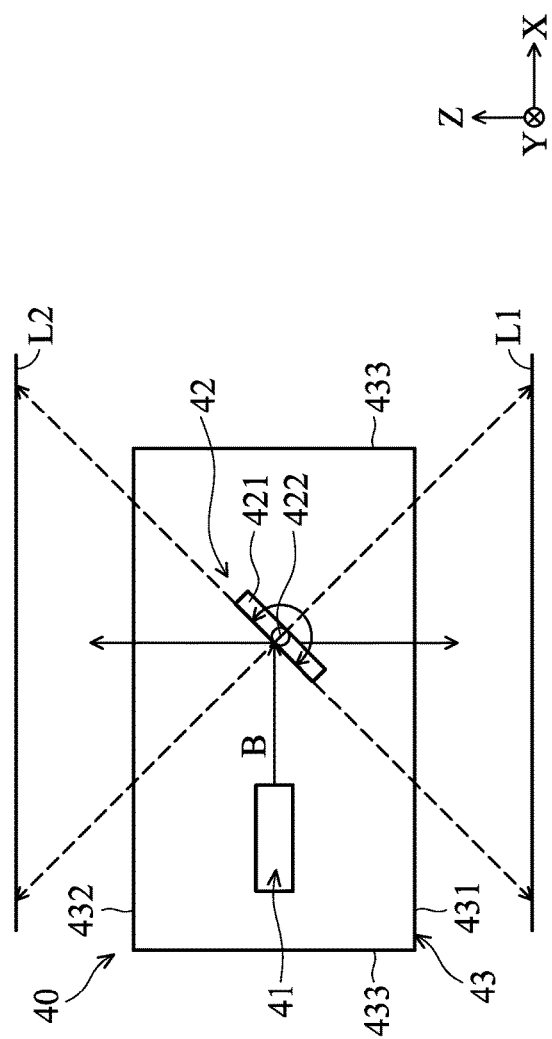
FIG. 4 is a schematic view of a positioning device in accordance with some embodiments.

FIG. 4 is a schematic view of a positioning device 40 in accordance with some embodiments. The positioning device 40 includes a laser source 41, an optical assembly 42, and a casing 43 for accommodating the laser source 41 and the optical assembly 42. In some embodiments, the casing 43 is a hexahedral structure (see also FIG. 6) having a bottom surface 431 (first surface), a top surface 432 (second surface), and four side surfaces 433, wherein the bottom surface 431 and top surface 432 are opposite and parallel to each other. The size of the casing may be the same or similar to that of the carrier 30 described above. The casing 43 may be made of a transparent acrylic material or the like.

The laser source 41 is configured and operable to generate a laser beam B toward the optical assembly 42. The laser source 41 may be any type of laser source suitable for being placed into the casing 43. In addition, the laser beam B may be any color which can be clearly viewed by the operators in the FAB.

The optical assembly 42 is configured to direct the laser beam B projected from the laser source 41 toward the floor P1 and ceiling P2 (FIG. 1 and FIG. 2) of the FAB to generate a first laser line L1 on the floor P1 and a second laser line L2 on the ceiling P2. In some embodiments, when the casing 43 is provided into the FAB and its bottom surface 431 and top surface 432 are parallel to the floor P1 and ceiling P2, the laser beam B generated by the laser source 41 is directed by the optical assembly 42 to pass through the bottom surface 431 and the top surface 432 of the casing 43 to generate the first laser line L1 (on the floor P1) and the second laser line L2 (on the ceiling P2) which are parallel to and aligned with each other when viewed in a direction (e.g. the Z-axis direction) perpendicular to the floor P1 and the ceiling P2.

In some embodiments as shown in FIG. 4, the optical assembly 42 includes a reflector 421, a shaft 422, and a drive mechanism (not shown). The reflector 421 may be a double-sided mirror. The shaft 422 is configured to couple the reflector 421 to the casing 43 and extends along a direction (e.g. the Y-axis direction) parallel to the first and second surfaces 431 and 432 of the casing 43. The drive mechanism (e.g. a motor) is configured and operable to drive the shaft 422 and the reflector 421 to rotate so that the laser beam B generated by the laser source 41 is directed by the rotated reflector 421 toward the floor P1 and the ceiling P2 to generate the first and second laser lines L1 and L2.

Figure 5:
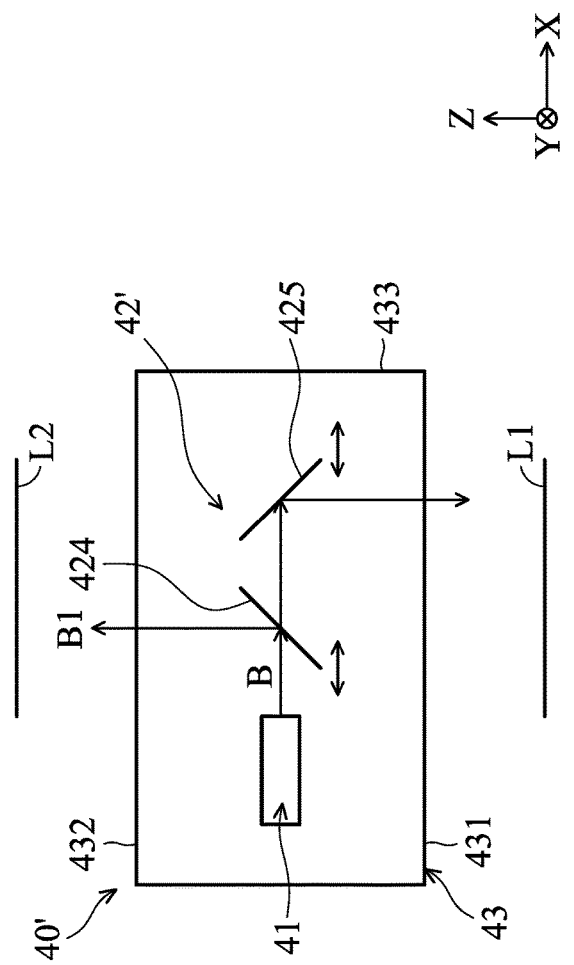
FIG. 5 is a schematic view of a positioning device in accordance with some embodiments.

FIG. 5 is a schematic view of a positioning device 40' in accordance with some alternative embodiments. The positioning device 40' differs from the positioning device 40 of FIG. 4 in that the optical assembly 42' of the positioning device 40' includes a beam splitter 424, a reflector 425, and a drive mechanism (not shown).

The beam splitter 424 may be disposed between the laser source 41 and the reflector 425 and is configured to split the laser beam B into a first beam B1 toward one of the floor P1 and ceiling P2 of the FAB and a second beam B2 toward the reflector 425. In some embodiments, the beam splitter 424 is a triangular prism or a cube prism. The reflector 425 is configured to direct the second beam B2 toward the other of the floor P1 and ceiling P2. The reflector 425 may be a one-side mirror. The drive mechanism is configured and operable to drive the beam splitter 424 and the reflector 425 to move with respect to the laser source 41 in a direction (e.g. the X-axis direction) parallel to the first and second surfaces 431 and 432 of the casing 43. In some embodiments, the drive mechanism include a track, sliders coupling the beam splitter 424 and the reflector 425 to the track, and one or more motors for driving the sliders along the track. Accordingly, the laser beam B generated by the laser source 41 is directed by the movable beam splitter 424 and the reflector 425 toward the floor P1 and the ceiling P2 to generate the first and second laser lines L1 and L2, similar to the effect of the positioning device 40 of FIG. 4.

Next, the positioning methods of using the positioning devices described above for assisting alignment of the rail 11 of an OHT system 10 and the load port 21 of a semiconductor tool 20 in the FAB in accordance with some embodiments are illustrated with reference to FIGS. 6-13. The variations of some embodiments are discussed. Throughout the various views and illustrative embodiments, like reference numbers are used to designate like elements.

Figure 6A:
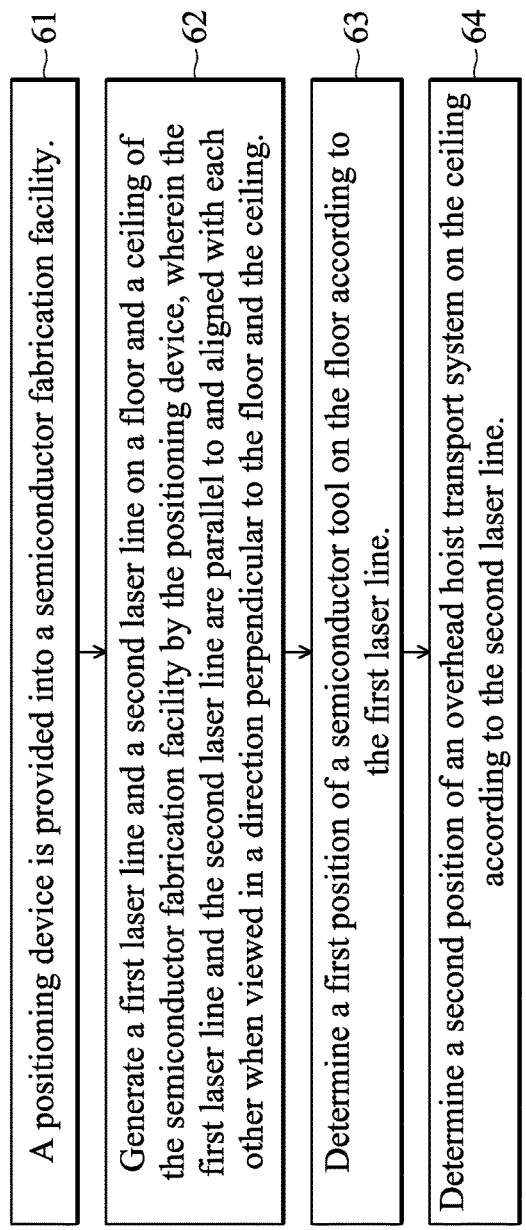
FIG. 6A is a flow chart of a positioning method in accordance with some embodiments.
Figure 6B:
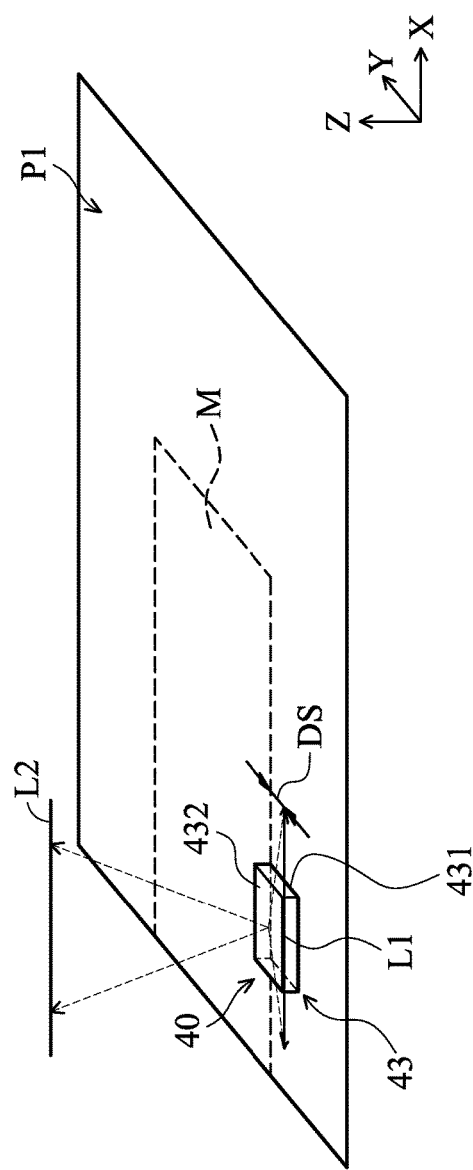
FIG. 6B is a schematic view illustrating an intermediate stage of a positioning method of using a positioning device in accordance with some embodiments.

Referring to FIG. 6A and FIG. 6B, wherein FIG. 6A is a flow chart of a positioning method 60 in accordance with some embodiments, and FIG. 6B is a schematic view illustrating an intermediate stage of the positioning method 60 of using a positioning device in accordance with some embodiments. In operation 61 of the positioning method 60, a positioning device 40 (e.g. the positioning device 40 of FIG. 4) is provided into a semiconductor fabrication facility (FAB), as shown in FIG. 6B. In some embodiments, the positioning device 40 is provided into the FAB and placed on the floor P1 of the FAB, before a semiconductor tool 20 and an OHT system 10 are loaded into the FAB.

In operation 62, a first laser line L1 on the floor P1 and a second laser line L2 on the ceiling (not shown) of the FAB are generated by the positioning device 40 as shown in FIG. 6B. As described above, the first laser line L1 and second laser line L2 generated by the positioning device 40 are parallel to and aligned with each other when viewed in a direction (e.g. Z-axis direction) perpendicular to the floor P1 and the ceiling. In some embodiments as shown in FIG. 6B, the first laser line L1 and second laser line L2 are parallel to a direction (e.g. the X-axis direction) to which the semiconductor tool 20 and the OHT system 10 that are to be loaded into the FAB are parallel.

In operation 63, the position (first position) of the semiconductor tool 20 on the floor P1 is determined according to the first laser line L1. In operation 64, the position (second position) of the OHT system 10 on the ceiling is determined according to the second laser line L2. In some embodiments, the first laser line L1 and the second laser line L2, which are parallel to and aligned with each other, may be used to determine the positions of the load port 21 of the semiconductor tool 20 and the rail 11 of the OHT system 10 in the Y-axis direction.

For example, since the distance DS between the center O of the coupling interface 211 of the load port 21 and the front surface 221 of the main body 22 of the semiconductor tool 20 is predetermined (FIG. 3), the semiconductor tool 20 may be loaded into the FAB so that the front surface 221 of the main body 22 is parallel to the first laser line L1 on the floor P1 and spaced from the first laser line L1 by the distance DS (i.e. positioned at the first position), as the dotted line M depicted in FIG. 6B. Therefore, the positioning of the semiconductor tool 20 and the load port 21 thereof in the FAB is achieved.

Also, The OHT system 10 may be loaded into the FAB so that the center line C1 of the rail 11 is parallel to and aligned with the second laser line L2 on the ceiling (i.e. positioned at the second position). Consequently, the positioning of the rail 11 of the OHT system 10 in the FAB and the alignment of the rail 11 and the load port 21 of the semiconductor tool 20 in the Y-axis direction can also be achieved.

Figure 7:
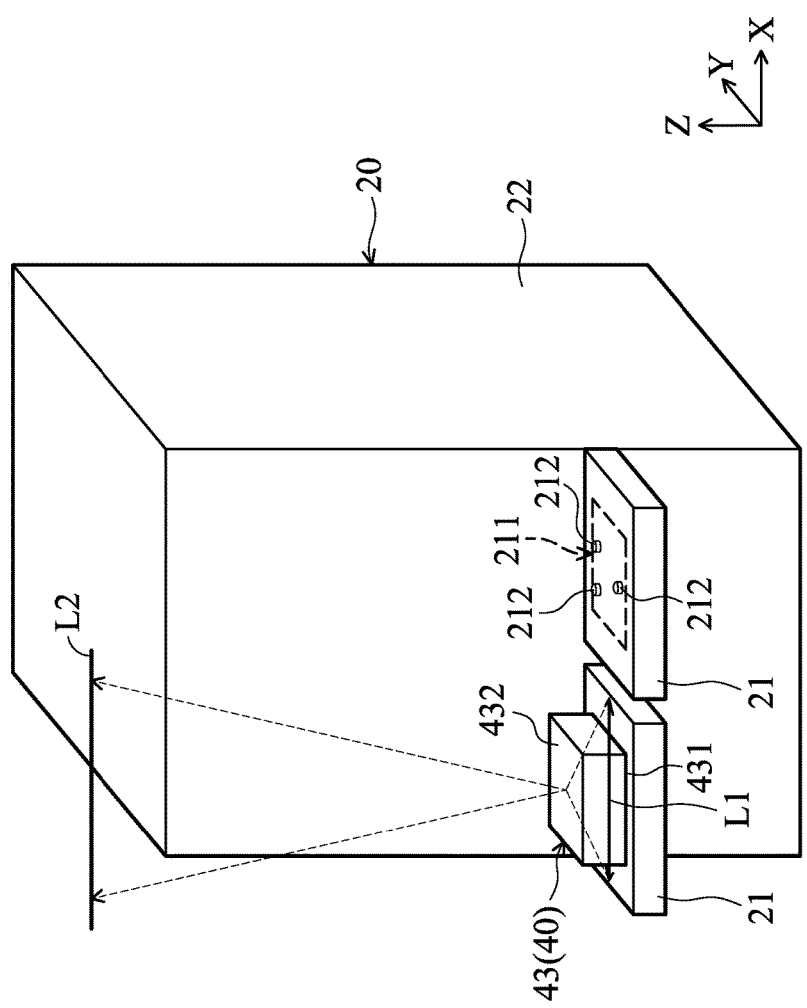
FIG. 7 is a schematic view illustrating an intermediate stage of a positioning method of using a positioning device in accordance with some embodiments.
Figure 8:
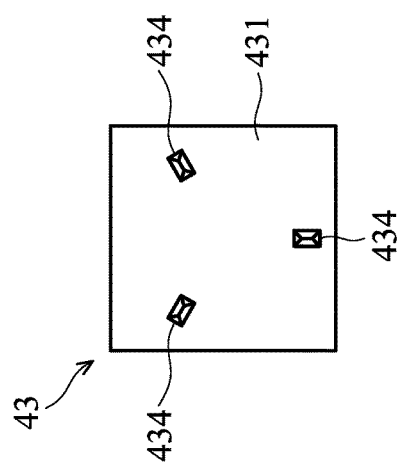
FIG. 8 is a schematic view of the bottom surface of the positioning device in FIG. 7 in accordance with some embodiments.

FIG. 7 is a schematic view illustrating an intermediate stage of a positioning method of using a positioning device in accordance with some alternative embodiments. As shown in FIG. 7, after the semiconductor tool 20 is positioned on the floor P1 of the FAB according to the first laser line L1 as described above in FIG. 6B, the positioning device 40 may also be installed on a load port 21 of the semiconductor tool 20. In some embodiments, the positioning device 40 is installed on the load port 21 by coupling the bottom surface 431 of the casing 43 to the coupling interface 211 of the load port 21 that is used to receive the carrier 30. In some embodiments as shown in FIG. 8, the bottom surface 431 of the casing 43 and the bottom surface of the carrier 30 attached to the coupling interface 211 of the load port 21 have the same dimensions and/or the same structure including a plurality of coupling mechanisms such as grooves 434 for docking to the load port 21. With the above arrangement, the first laser line L1 generated by the positioning device 40 passes through the center O of the coupling interface 211 of the load port 21.

Afterwards, the rail 11 of the OHT system 10 may be positioned on the ceiling of the FAB so that the center line C1 of the rail 11 is aligned with the second laser line L2 generated by the positioning device 40, thereby achieving the alignment of the rail 11 and the load port 21 of the semiconductor tool 20 in the Y-axis direction, for example. Note that in the embodiments of FIG. 7, the rail 11 of the OHT system 10 may be aligned with the load port 21 of the semiconductor tool 20 more accurately because the rail 11 is positioned according to the second laser line L2 generated by the positioning device 40 attached to the load port 21 of the semiconductor tool 20 that is positioned already.

Figure 9:
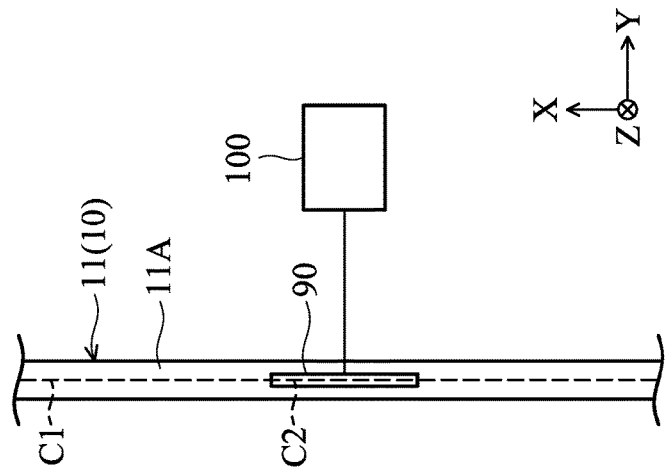
FIG. 9 is a schematic view illustrating the rail of an OHT system with a light detector thereon in accordance with some embodiments.

Furthermore, in order to align the rail 11 of the OHT system 10 and the load port 21 of the semiconductor tool 20 more easily and accurately, a light detector 90 may be installed on the rail 11 for detecting the second laser line L2 generated by the positioning device 40 on the load port 21. In some embodiments as shown in FIG. 9, the light detector 90 is attached to the surface 11A of rail 11 facing toward the load port 21. Moreover, the light detector 90 is configured and structured to extend along a direction (e.g. the X-axis direction) parallel to the center line C1 of the rail 11, and the center line C2 of the light detector 90 is aligned with the center line C1 of the rail 11.

In some embodiments, the light detector 90 is a photodiode coupled to a processing unit 100. The processing unit 100 may be a computer which is configured to receive a detection signal (e.g. current signal) from the light detector 90 and show the detection result of the light detector 90 by a displayer. For example, when the rail 11 of the OHT system 10 is not aligned with the load port 21 of the semiconductor tool 20, the light detector 90 cannot detect the second laser line L2 generated by the positioning device 40 and thus generate a low detection/current signal; whereas, when the rail 11 of the OHT system 10 is accurately aligned with the load port 21 of the semiconductor tool 20, the light detector 90 detects the second laser line L2 generated by the positioning device 40 and thus generate a high detection/current signal. The processing unit 100 may show the detection result (e.g. a current-voltage curve) on a display for operators to watch.

FIG. 10 is a schematic view illustrating an intermediate stage of a positioning method of using a positioning device in accordance with some alternative embodiments. As shown in FIG. 10, after the OHT system 10 is positioned on the ceiling P2 of the FAB according to the second laser line L2 as described above in FIG. 6B, the positioning device 40 may also be installed on the vehicle 12 of the OHT system 10. In some embodiments, the positioning device 40 is installed on the vehicle 12 by coupling the top surface 432 of the casing 43 to the gripper 123 of the vehicle 12 that is used to grip the carrier 30. In some embodiments as shown in FIG. 11, the top surface 432 of the casing 43 and the top surface of the carrier 30 (FIG. 1 and FIG. 2) attached to the gripper 123 have the same dimensions and/or the same structure including a mating flange 435 for grasping by the gripper 123. With the above arrangement, the second laser line L2 generated by the positioning device 40 is aligned with the center line C1 (FIG. 3) of the rail 11 of the OHT system 10.

Afterwards, the semiconductor tool 20 may be positioned on the floor P1 of the FAB so that the first laser line L1 generated by the positioning device 40 passes through the center O of the coupling interface 211 of the load port 21, thereby achieving the alignment of the rail 11 of the OHT system 10 and the load port 21 in the Y-axis direction. Note that in the embodiments of FIG. 10, the load port 21 of the semiconductor tool 20 may be aligned with the rail 11 of the OHT system 10 more accurately because the semiconductor tool 20 is positioned according to the first laser line L1 generated by the positioning device 40 attached to the vehicle 12 of the OHT system 10 that is positioned already.

Figure 12:
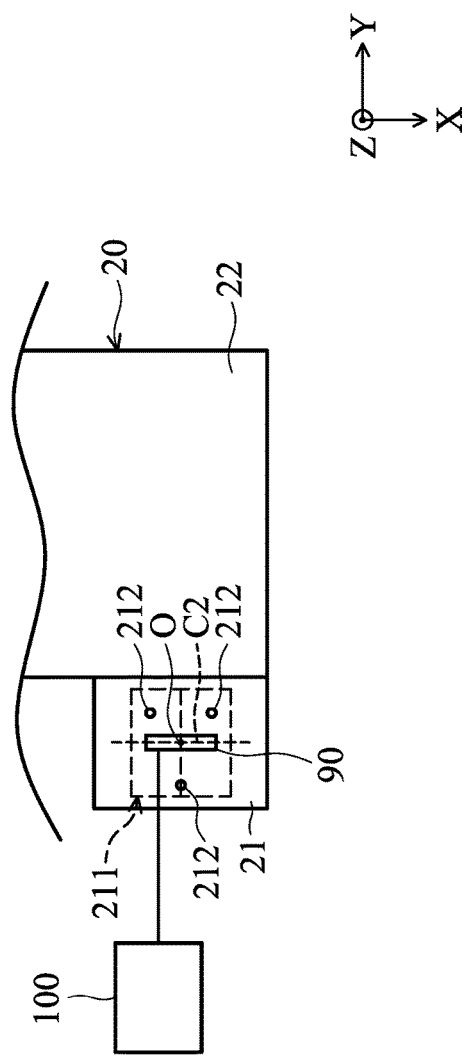
FIG. 12 is a schematic view illustrating the coupling interface of the load port of a semiconductor tool with a light detector thereon in accordance with some embodiments.

Furthermore, in order to align the rail 11 of the OHT system 10 and the load port 21 of the semiconductor tool 20 more easily and accurately, a light detector 90 (similar to or the same as the light detector 90 in FIG. 9) may be installed on the load port 21 of the semiconductor tool 20 for detecting the first laser line L1 generated by the positioning device 40 on the vehicle 12 of the OHT system 10. In some embodiments as shown in FIG. 12, the light detector 90 is attached to the coupling interface 211 of the load port 21 facing toward the vehicle 12. Moreover, light detector 90 is configured and structured to extend along a direction (e.g. the X-axis direction) parallel to the center line C1 of the rail 11, and the center line C2 of the light detector 90 passes through the center O of the coupling interface 211 of the load port 21.

Similar to the embodiments described above, the detection result of the light detector 90 may be used to determine whether the rail 11 of the OHT system 10 and the load port 21 of the semiconductor tool 20 are aligned with each other, thereby improving the accuracy of the installation work.

Figure 13:
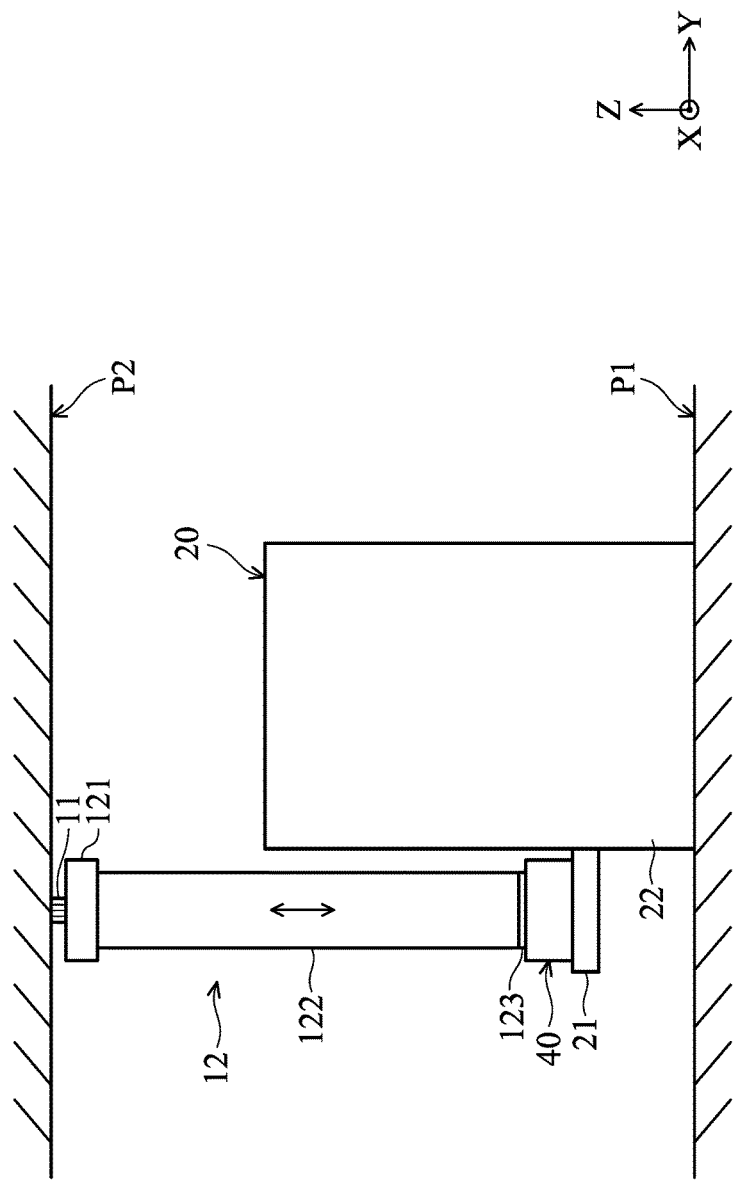
FIG. 13 is a schematic view illustrating an intermediate stage of a positioning method of using a positioning device in accordance with some embodiments.

Referring to FIG. 13, after the OHT system 10 and the semiconductor tool 20 are positioned in the FAB according to the first laser line L1 and second laser line L2 generated from the positioning device 40, the gripper 123 of the vehicle 12 of the OHT system 10 may also grip the positioning device 40 and move to deposit the positioning device 40 onto the load port 21 of semiconductor tool 20, in some embodiments. In such cases, the positioning device 40 may be used to imitate the carrier 30 which can be attached to the gripper 123 and coupled to the coupling interface 211 of the load port 21. With this design, the positioning device 40 may further be used to check the alignment of the rail 11 of the OHT system 10 and the load port 21 of the semiconductor tool 20.

The embodiments of the present disclosure have some advantageous features: The positioning device generates a pair of laser lines respectively on the floor and ceiling of the FAB, wherein the laser lines are parallel to and aligned with each other. Therefore, the laser lines can be used to assist in aligning the OHT system mounted on the ceiling and the semiconductor tool mounted on the floor, so as to avoid the misalignment of the rail of the OHT system and the load port of the semiconductor tool during installation. Consequently, the installation time and the cost are saved, and the production yield is improved. Furthermore, the light detector may be installed on the rail of the OHT system or the load port of the semiconductor tool for detecting the laser lines, thereby improving the accuracy of the installation work.

In some embodiments, a positioning device is provided. The positioning device includes a laser source and an optical assembly. The optical assembly is configured to direct a laser beam projected from the laser source toward a floor and a ceiling of a semiconductor fabrication facility to generate a first laser line on the floor and a second laser line on the ceiling. The first laser line and the second laser line are parallel to and aligned with each other when viewed in a direction perpendicular to the floor and the ceiling.

In some embodiments, a semiconductor fabrication system is provided. The semiconductor fabrication system includes a semiconductor tool, an overhead hoist transport system, a positioning device, and a light detector. The semiconductor tool is placed on a floor of a semiconductor fabrication facility and has a load port. The overhead hoist transport system is placed on a ceiling of the semiconductor fabrication facility and configured to transport a carrier onto the load port of the semiconductor tool. The positioning device is configured to be installed on one of the semiconductor tool and the overhead hoist transport system and includes a laser source and an optical assembly. The optical assembly is configured to direct a laser beam projected from the laser source toward the floor and the ceiling to generate a first laser line on the floor and a second laser line on the ceiling. The first laser line and the second laser line are parallel to and aligned with each other when viewed in a direction perpendicular to the floor and the ceiling. The light detector is configured to be installed on the other of the semiconductor tool and the overhead hoist transport system for detecting the first laser line or the second laser line.

In some embodiments, a positioning method is provided. The positioning method includes providing a positioning device into a semiconductor fabrication facility. The positioning method further includes generating a first laser line and a second laser line on a floor and a ceiling of the semiconductor fabrication facility by the positioning device. The first laser line and the second laser line are parallel to and aligned with each other when viewed in a direction perpendicular to the floor and the ceiling. The positioning method also includes determining a first position of a semiconductor tool on the floor according to the first laser line. The positioning method also includes determining a second position of an overhead hoist transport system on the ceiling according to the second laser line.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A positioning device, comprising:
   a laser source; and
   an optical assembly configured to direct a laser beam projected from the laser source toward a floor and a ceiling of a semiconductor fabrication facility to generate a first laser line on the floor and a second laser line on the ceiling, wherein the first laser line and the second laser line are parallel to and aligned with each other when viewed in a direction perpendicular to the floor and the ceiling.

2. The positioning device as claimed in claim 1, further comprising a casing configured to accommodate the laser source and the optical assembly, wherein the laser beam is directed by the optical assembly to pass through a first surface and a second surface of the casing, opposite to each other and parallel to the floor and ceiling, to generate the first and second laser lines on the floor and the ceiling.

3. The positioning device as claimed in claim 2, wherein the optical assembly includes a reflector, a shaft, and a drive mechanism, the shaft is configured to couple the reflector to the casing and extends along a direction parallel to the first and second surfaces of the casing, and the drive mechanism is configured to drive the shaft and the reflector to rotate so that the laser beam is directed by the reflector toward the floor and the ceiling to generate the first and second laser lines.

4. The positioning device as claimed in claim 2, wherein the optical assembly includes a beam splitter, a reflector, and a drive mechanism, the beam splitter is disposed between the laser source and the reflector and configured to split the laser beam into a first beam toward one of the floor and the ceiling and a second beam toward the reflector which is configured to direct the second beam toward the other of the floor and the ceiling, and the drive mechanism is configured to drive the beam splitter and the reflector to move with respect to the laser source in a direction parallel to the first and second surfaces of the casing, so that the laser beam is directed by the beam splitter and the reflector toward the floor and the ceiling to generate the first and second laser lines.

5. A semiconductor fabrication system, comprising:
   a semiconductor tool placed on a floor of a semiconductor fabrication facility and having a load port;
   an overhead hoist transport system placed on a ceiling of the semiconductor fabrication facility and configured to transport a carrier onto the load port of the semiconductor tool;
   a positioning device configured to be installed on one of the semiconductor tool and the overhead hoist transport system, the positioning device including:
      a laser source; and
      an optical assembly configured to direct a laser beam projected from the laser source toward the floor and the ceiling to generate a first laser line on the floor and a second laser line on the ceiling, wherein the first laser line and the second laser line are parallel to and aligned with each other when viewed in a direction perpendicular to the floor and the ceiling; and
   a light detector configured to be installed on the other of the semiconductor tool and the overhead hoist transport system for detecting the first laser line or the second laser line.

6. The semiconductor fabrication system as claimed in claim 5, wherein the positioning device further includes a casing configured to accommodate the laser source and the optical assembly, and the laser beam is directed by the optical assembly to pass through a first surface and a second surface of the casing, opposite to each other and parallel to the floor and ceiling, to generate the first and second laser lines on the floor and ceiling.

7. The semiconductor fabrication system as claimed in claim 6, wherein the optical assembly includes a reflector, a shaft, and a drive mechanism, the shaft is configured to couple the reflector to the casing and extends along a direction parallel to the first and second surfaces of the casing and perpendicular to a long axis of a rail of the overhead hoist transport system, and the drive mechanism is configured to drive the shaft and the reflector to rotate so that the laser beam is directed by the reflector toward the floor and the ceiling to generate the first and second laser lines.

8. The semiconductor fabrication system as claimed in claim 6, wherein the positioning device is installed on the semiconductor tool by coupling the first surface of the casing to a coupling interface of the load port that is used to receive the carrier, and the light detector is installed on a rail of the overhead hoist transport system and configured to extend along a direction parallel to a center line of the rail.

9. The semiconductor fabrication system as claimed in claim 8, wherein the first surface of the casing and a bottom surface of the carrier attached to the coupling interface of the load port have the same dimensions and/or the same structure.

10. The semiconductor fabrication system as claimed in claim 8, wherein the first laser line generated by the positioning device passes through a center of the coupling interface of the load port, and a center line of the light detector is aligned with the center line of the rail.

11. The semiconductor fabrication system as claimed in claim 6, wherein the positioning device is installed on a vehicle of the overhead hoist transport system by coupling the second surface of the casing to a gripper of the vehicle that is used to grip the carrier, and the light detector is installed on the load port and configured to extend along a direction parallel to a center line of a rail.

12. The semiconductor fabrication system as claimed in claim 11, wherein the second surface of the casing and a top surface of the carrier attached to the gripper have the same dimensions and/or the same structure.

13. The semiconductor fabrication system as claimed in claim 11, wherein the second laser line generated by the positioning device is aligned with a center line of the rail of the overhead hoist transport system, and the center line of the light detector passes through a center of a coupling interface of the load port that is used to receive the carrier.

14. The semiconductor fabrication system as claimed in claim 11, wherein the gripper of the vehicle is configured to grip the positioning device and move to deposit the positioning device onto the load port.

15. The semiconductor fabrication system as claimed in claim 5, further comprising a processing unit configured to receive a detection signal from the light detector.

16. A positioning method, comprising:
   providing a positioning device into a semiconductor fabrication facility;
   generating a first laser line and a second laser line on a floor and a ceiling of the semiconductor fabrication facility by the positioning device, wherein the first laser line and the second laser line are parallel to and aligned with each other when viewed in a direction perpendicular to the floor and the ceiling;
   determining a first position of a semiconductor tool on the floor according to the first laser line; and
   determining a second position of an overhead hoist transport system on the ceiling according to the second laser line.

17. The positioning method as claimed in claim 16, further comprising:
   positioning the semiconductor tool at the first position on the floor according to the first laser line;
   installing the positioning device on a load port of the semiconductor tool; and
   positioning a rail of the overhead hoist transport system at the second position on the ceiling so that a center line of the rail is aligned with the second laser line generated by the positioning device.

18. The positioning method as claimed in claim 17, further comprising:
   determining whether the load port of the semiconductor tool and the rail are aligned with each other by detecting the second laser line by a light detector on the rail of the overhead hoist transport system.

19. The positioning method as claimed in claim 16, further comprising:
   positioning a rail of the overhead hoist transport system at the second position on the ceiling according to the second laser line;
   installing the positioning device on a vehicle of the overhead hoist transport system; and
   positioning the semiconductor tool at the first position on the floor so that the first laser line generated by the positioning device passes through a center of a coupling interface of a load port of the semiconductor tool.

20. The positioning method as claimed in claim 19, further comprising:
   determining whether the load port and the rail of the overhead hoist transport system are aligned with each other by detecting the first laser line by a light detector on the load port of the semiconductor tool.

* * * * *